United States Patent
Cottier et al.

(10) Patent No.: US 7,710,796 B2
(45) Date of Patent: May 4, 2010

(54) LEVEL SHIFTER FOR BOOSTING WORDLINE VOLTAGE AND MEMORY CELL PERFORMANCE

(75) Inventors: Scott R. Cottier, Cedar Park, TX (US); Sang Hoo Dhong, San Jose, CA (US); Rajiv V. Joshi, Yorktown Heights, NY (US); Juergen Pille, Stuttgart (DE); Osamu Takahashi, Round Rock, TX (US)

(73) Assignee: International Business Machines Corporation, Armonk, NY (US)

( * ) Notice: Subject to any disclaimer, the term of this patent is extended or adjusted under 35 U.S.C. 154(b) by 183 days.

(21) Appl. No.: 11/935,741

(22) Filed: Nov. 6, 2007

(65) Prior Publication Data

US 2009/0116307 A1    May 7, 2009

(51) Int. Cl.
*G11C 7/00*    (2006.01)
(52) U.S. Cl. .................... 365/189.11; 365/189.04; 365/189.12; 365/230.06
(58) Field of Classification Search ............ 365/189.11, 365/189.12, 189.04, 230.06, 240
See application file for complete search history.

(56) References Cited

U.S. PATENT DOCUMENTS

| 5,602,796 | A | 2/1997 | Sugio |
|---|---|---|---|
| 6,304,469 | B1 | 10/2001 | Liu |
| 6,373,773 | B2 | 4/2002 | Sumimoto |
| 6,510,089 | B2* | 1/2003 | Taura et al. ............. 365/189.11 |
| 6,671,201 | B2* | 12/2003 | Masuda ...................... 365/154 |
| 6,852,578 | B2 | 2/2005 | Chang |
| 7,023,738 | B2 | 4/2006 | Vimercati et al. |
| 7,355,905 | B2* | 4/2008 | Campbell et al. ...... 365/189.11 |
| 7,359,272 | B2* | 4/2008 | Wang et al. ................. 365/226 |
| 7,463,545 | B2* | 12/2008 | Kumala ................. 365/230.06 |
| 2005/0013180 | A1 | 1/2005 | Koyama et al. |

FOREIGN PATENT DOCUMENTS

| EP | 0575188 | 12/1993 |
|---|---|---|
| JP | 2004-134047 | 4/2004 |
| JP | 2005-222659 | 8/2005 |

\* cited by examiner

*Primary Examiner*—Pho M. Luu
(74) *Attorney, Agent, or Firm*—Tutunjian & Bitetto, P.C.; Brian Verminski, Esq.

(57) ABSTRACT

A circuit and method includes first circuits powered by a first supply voltage and second circuits powered by a second supply voltage. A level shifter is coupled between the first circuits and the second circuits. The level shifter is configured to select a supply voltage output for a circuit including one of the first supply voltage and the second supply voltage in accordance an input signal, where the input signal depends on at least one of an operation to be performed and component performing the operation.

18 Claims, 8 Drawing Sheets

LEVEL SHIFTER FOR BOOSTING WORDLINE VOLTAGE AND MEMORY CELL PERFORMANCE

BACKGROUND

1. Technical Field

The present invention relates to memory circuits and more particularly to a memory circuit and method having/using a level shifter for controlling cell voltages during memory operations.

2. Description of the Related Art

Static Random Access Memory (SRAM) is one of the key components in semiconductor processors and computer systems. As technology advances and printed features in semiconductor chips become smaller, SRAM design is facing a difficult problem which arises from the statistical variation of process parameters in each SRAM cell. Traditionally, SRAM design depends on the symmetric nature of an SRAM cell. When the symmetry is broken due to local variation of process parameters, SRAM designs become susceptible to stability issues where an SRAM cell is so unbalanced and, as a result, it is no longer correctly functional for either read or write operations.

Another challenge in SRAM design is keeping up with ever increasing operating frequency. As technology advances, the devices in an SRAM cell become smaller than those in previous technologies. Since the newer process technologies face tougher problems, device performance may no longer scale at a same rate as feature scaling. As a result, the SRAM cell current in a newer process technology tends to be weaker than previous technologies. This means that SRAM performance may not fare as well compared with the previous technologies.

One of the techniques employed is separating power supplies to SRAM arrays and possibly SRAM array peripherals and boosting one power supply to a higher value than the rest of chip. In this way, the SRAM stability issue decreases, and the SRAM design can gain speed at the same time. However, issues with introducing separate power supplies with different potentials arise. When the difference in potential is small enough, the issue may be negligible. However, when the potential difference becomes large enough, the circuit at the boundary of the two supplies may malfunction or may experience issues such as excessive leakage.

SUMMARY

The present disclosure addresses issues for circuits with power supplies of different potential. Namely, the issues experienced by a circuit at boundaries of different power supplies are addressed by inserting a novel level shifter.

A circuit and method include first circuits powered by a first supply voltage and second circuits powered by a second supply voltage. A level shifter is coupled between the first circuits and the second circuits. The level shifter is configured to select a supply voltage output for a circuit including one of the first supply voltage and the second supply voltage in accordance an input signal, where the input signal depends on at least one of an operation to be performed and component performing the operation.

Another memory circuit includes an address decoder circuit configured to decode memory addresses to activate memory cells. The address decoder circuit has a first supply voltage. A wordline driver circuit is configured to activate wordlines in accordance with decoded memory addresses. A level shifter is coupled to the address decoder circuit and to the wordline driver circuit. The level shifter is configured to select a supply voltage output including one of the first supply voltage and a second supply voltage in accordance an input signal, where the input signal depends on at least one of an operation to be performed and component performing the operation.

A method for selectively reducing power includes providing a level shifter coupled between first circuits and second circuits where the first circuits are powered by a first supply voltage and the second circuits powered by one of the first supply voltage and a second supply voltage, and selectively activating the second circuits with one of the first supply voltage and the second supply voltage in accordance with an input signal to balance between performance and power savings.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

In accordance with the present principles, a level shifter is provided for memory circuits, which works by converting one voltage potential to a second voltage potential while maintaining a gate-to-source voltage differential substantially equal to a predetermined amount (e.g. 0V) when a device (e.g., a transistor) is meant to be turned off.

When the magnitude of the gate-to-source voltage is non-zero, the device may begin to turn on and current begins to flow. When the desired result is for the device to be off, an increase in the leakage current and subsequently an increase in power consumption may be experienced with a non-zero gate-to-source voltage.

In addition, the leakage current causes output voltage transition time of the gate to be increased. As the voltage difference between the two sources increases, the output node will not fully charge/discharge. This may result in a more stringent requirement on the voltage supplies and distribution to maintain a constant voltage potential. Local variation in the supply potentials will change the delay of a conventional circuit and cause the hardware to perform at a reduced frequency to guarantee correct operation.

Static Random Access Memory (SRAM) designs employ very large device widths for driving wordline signals. The large device widths for the wordline drivers exacerbate the leakage issues since the amount of leakage is proportional to the device width. A voltage supply boundary occurs just before devices driving the address wordline signals to the SRAM array cells.

Placing a level shifter, in accordance with the present principles, alleviates the issues caused by having more than one voltage source. The leakage current and power consumption are also considerably reduced. The level shifter permits voltage boosting of the array wordlines increasing the maximum current of pass transistors in the SRAM cell. The boosted wordlines increase the read performance of the array and permit the SRAM design to achieve the same performance improvement as other logic when feature sizes are scaled.

The present disclosure will describe the present principles in terms of an illustrative example involving an SRAM memory circuit. It should be understood that other circuits and memory technologies may also benefit from the teachings presented herein. For example, the present principles are applicable to dynamic random access memories (DRAM), flash memories, read only memories, processors, etc.

Embodiments of the present invention can take the form of an entirely hardware embodiment, an entirely software embodiment or an embodiment including both hardware and software elements. In a preferred embodiment, the present invention is implemented in software, which includes but is not limited to firmware, resident software, microcode, etc. For example, the present principles may be incorporated in a circuit design tool or circuit analysis tool.

Furthermore, the invention can take the form of a computer program product accessible from a computer-usable or computer-readable medium providing program code for use by or in connection with a computer or any instruction execution system. For the purposes of this description, a computer-usable or computer readable medium can be any apparatus that may include, store, communicate, propagate, or transport the program for use by or in connection with the instruction execution system, apparatus, or device. The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD.

A data processing system suitable for storing and/or executing program code may include at least one processor coupled directly or indirectly to memory elements through a system bus. The memory elements can include local memory employed during actual execution of the program code, bulk storage, and cache memories which provide temporary storage of at least some program code to reduce the number of times code is retrieved from bulk storage during execution. Input/output or I/O devices (including but not limited to keyboards, displays, pointing devices, etc.) may be coupled to the system either directly or through intervening I/O controllers.

Network adapters may also be coupled to the system to enable the data processing system to become coupled to other data processing systems or remote printers or storage devices through intervening private or public networks. Modems, cable modem and Ethernet cards are just a few of the currently available types of network adapters.

Circuits as described herein may be part of the design for an integrated circuit chip. The chip design may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., Graphic Data System II (GDSII)) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Figure 1:
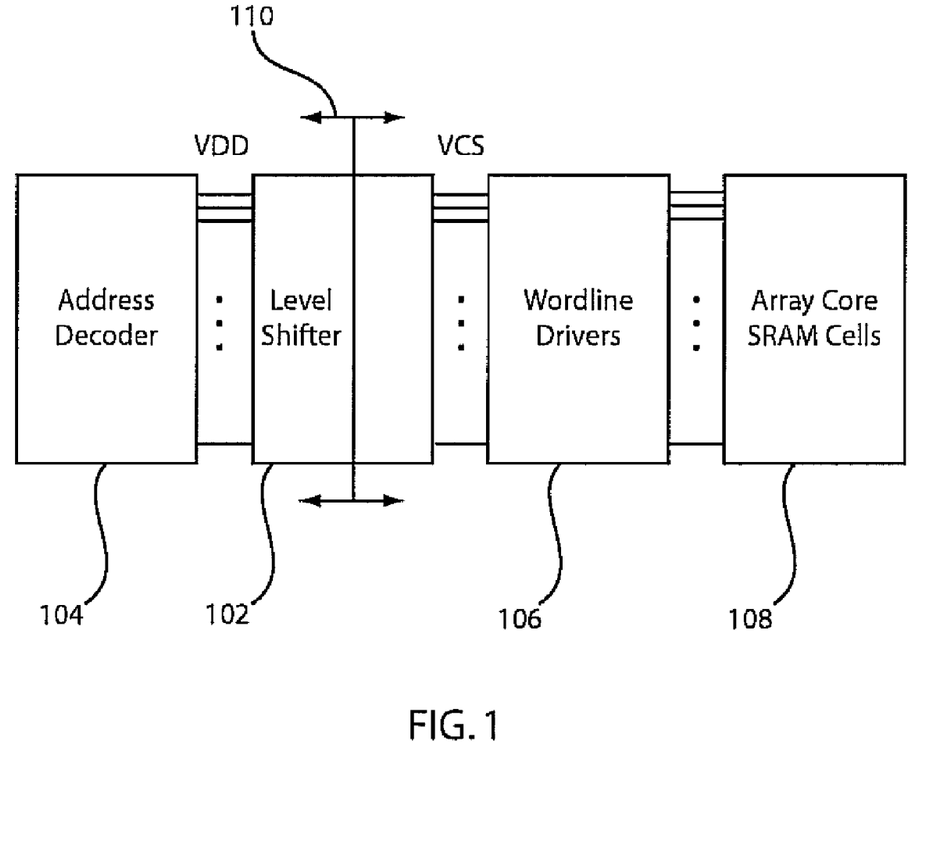
FIG. 1 is a schematic diagram showing a level shifter between power supply domains (e.g., VDD and VCS) in an SRAM memory circuit in accordance with one embodiment.

Referring now to the drawings in which like numerals represent the same or similar elements and initially to FIG. 1, one implementation using a level shifter in an SRAM design 100 is illustratively shown. SRAM design 100 is shown for illustrative purposes; however, any circuit or memory technology may be employed. In the exemplary embodiment shown, a level shifter 102 is employed between an address decoder circuit 104 and wordline drivers 106. This provides a clear and consistent boundary 110 between the two voltage potentials, VDD and VCS. VDD is the usual supply voltage for chips. VCS is an alternate voltage supply that can service memory elements and word line drivers of an SRAM, but not decode circuitry and other support circuitry within the SRAM.

The level shifter 102 for the wordline signals permits wordlines to be boosted to a voltage potential higher than a standard logic voltage, VDD. Placing the level shifter 102 at this location allows for an optimum balance of performance and power consumption, although the level shifter 102 may be placed at other locations as well.

Circuits connected to VCS, such as wordline drivers and memory cell access devices in array core 108 will consume more power than circuits connected to VDD. However, using VCS to improve selective circuit performance permits for overall chip level power savings. Instead of having to increase VDD voltage across the entire chip, the VCS voltage can be increased to selectively improve the slowest circuit paths with only a minimal impact to total chip power consumption.

SRAM cell performance in advanced technologies does not improve at the same rate as logic gates when the devices are scaled to smaller dimensions. SRAM cell performance therefore becomes a factor that can limit overall chip performance.

Figure 2:
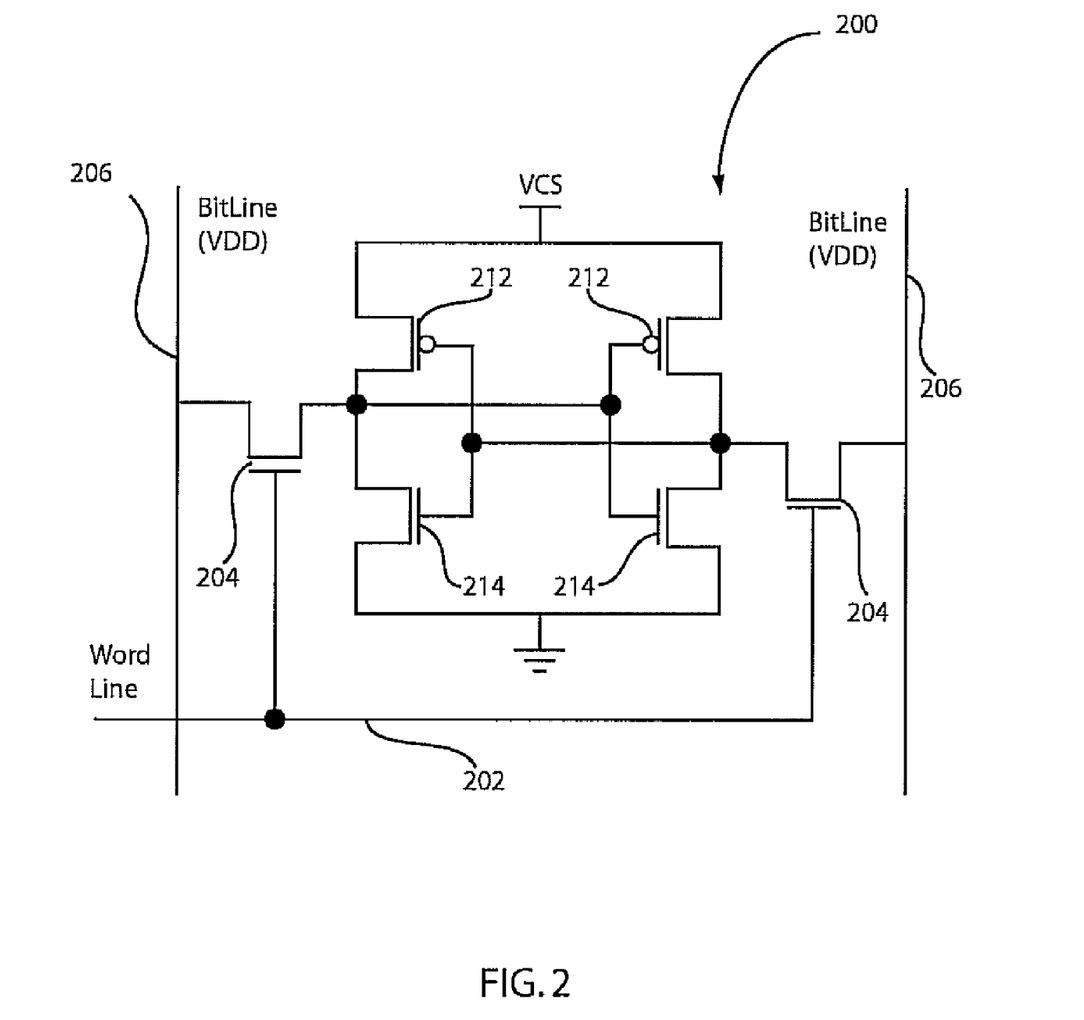
FIG. 2 is a schematic diagram showing an SRAM memory circuit having different power supply voltages in accordance with one embodiment.

Referring to FIG. 2, a boosted voltage on a wordline 202 provided by a level shifter (102) improves the read performance by increasing the maximum current which can flow through pass transistors 204 of an SRAM cell 200. Precharged bitlines 206 will then be pulled down more quickly by the cell thereby reducing the read access time. A stored logic value in transistors 212 and 214 of the cell 200 corresponds to a cell potential of VCS. The bitlines 206 are charged to the lower potential of VDD also reducing the time needed to pull the bitline low during a read operation.

Figure 3:
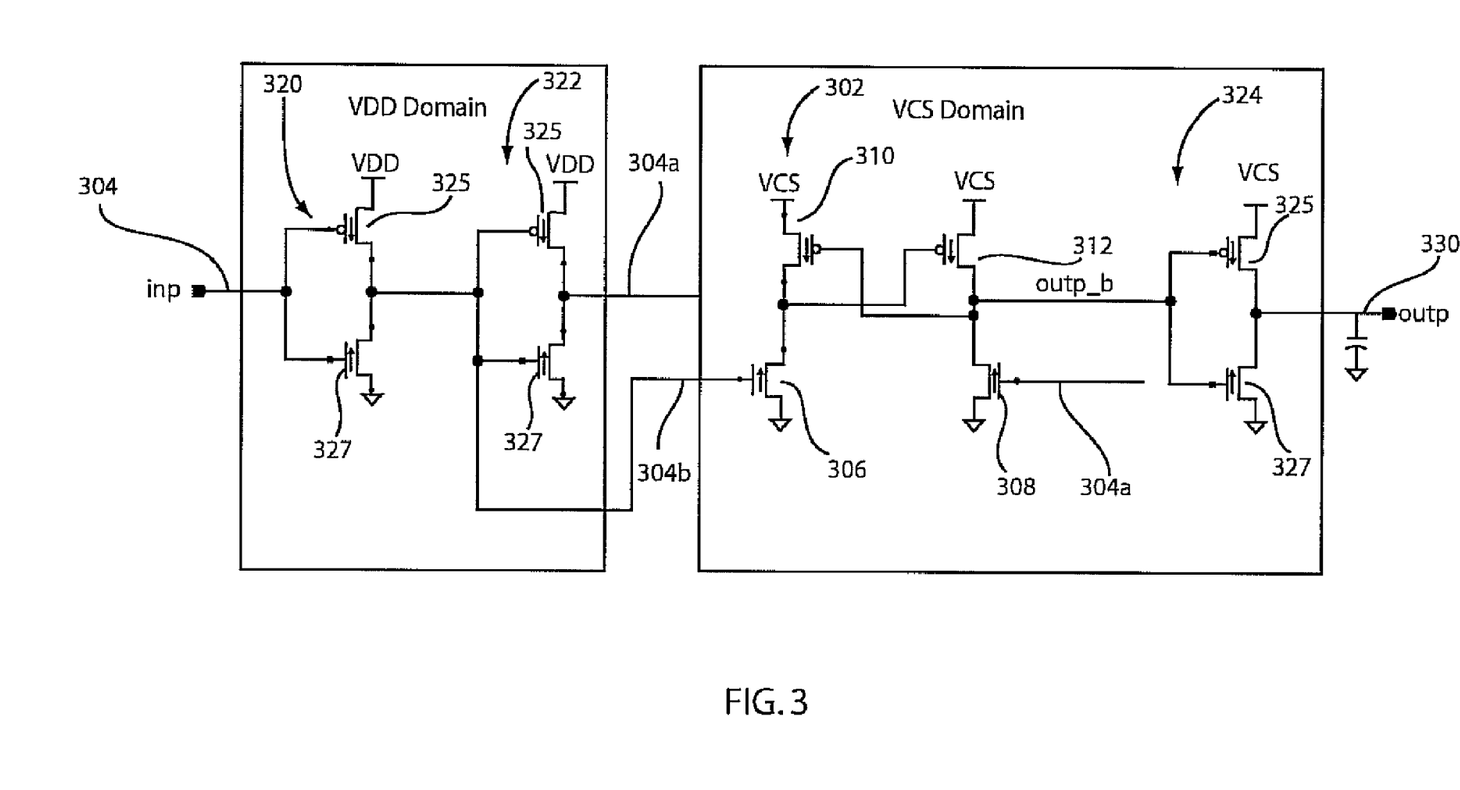
FIG. 3 is a schematic diagram showing a level shifter having a differential input for a differential design in accordance with one embodiment.

A level shifter works by isolating the voltage potential for a first group of circuits from a second voltage potential for a separate group of circuits. Referring to FIG. 3, a differential level shifter 302 is shown which may be incorporated in a circuit design. An input signal 304 is split to generate true and complement signals (304a, 304b) and each of the differential signals 304a and 304b controls an NMOS pull-down device 306 and 308, respectively. A maximum value of one of the differential signals is VDD. A high potential value for the gate nodes of PMOS cross-coupled devices 310 and 312 is derived from VCS. Functionally, one of the cross-coupled PMOS devices (310 or 312) is guaranteed to be frilly off, therefore no excess leakage will occur due to a partially activated device.

This differential implementation has time delay issues in generating the differential signals. There is a minimum of three gate delays caused by transistors in the level shifter path. An output 330 includes VCS. Inverter circuits 320, 322 and 324 include PMOS transistors 325 and NMOS transistors 327.

Figure 4:
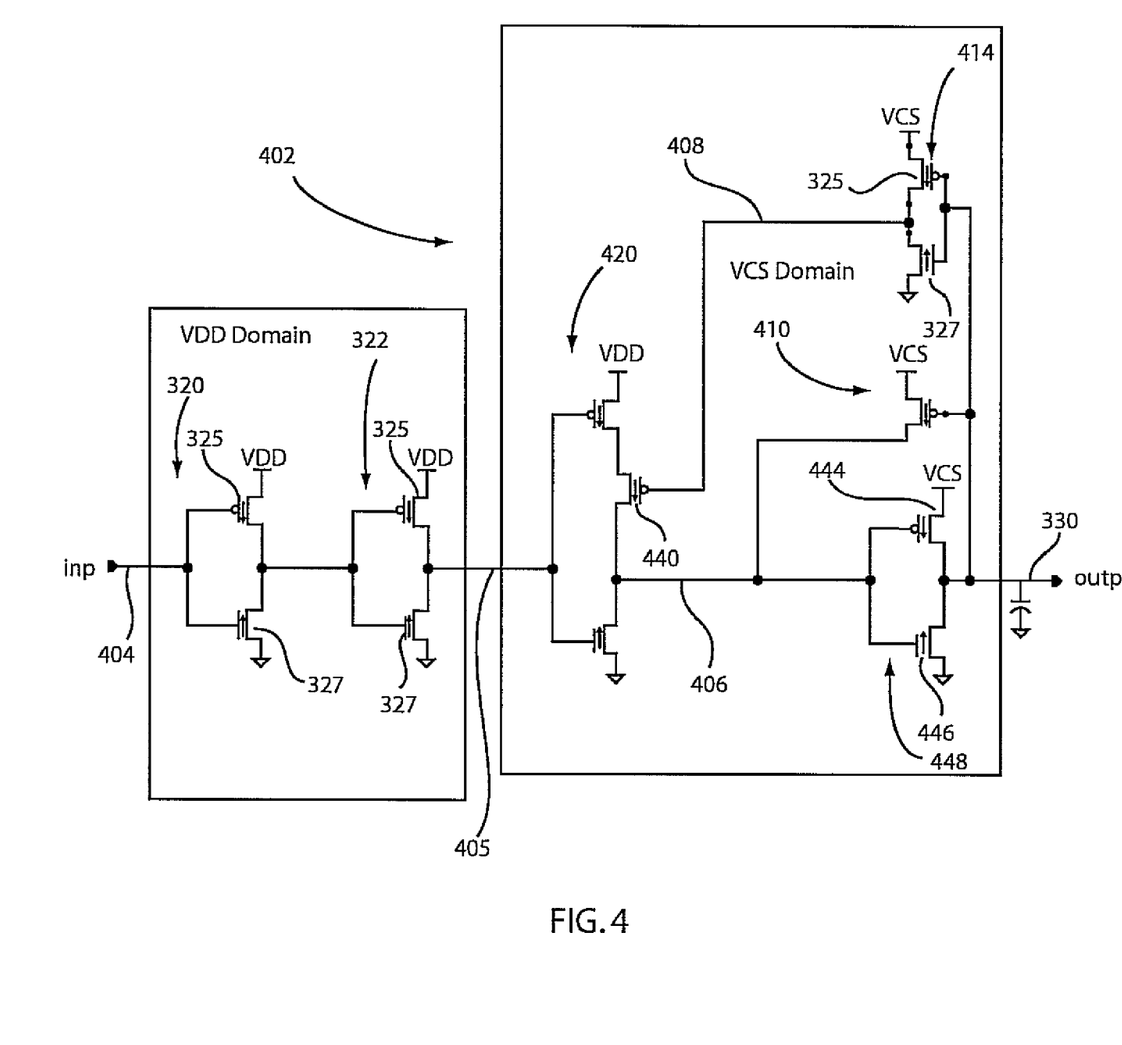
FIG. 4 is a schematic diagram showing a level shifter having a self shutdown mechanism feedback loop in accordance with one embodiment.

Referring to FIG. 4, a self shutdown level shifter 402 is illustratively depicted in accordance with another embodiment. Level shifter 402 includes a single input 404 (differential signals are not needed), which is delayed as a delayed input 405 before entering the VCS domain. A feedback controlled VDD pull-up stack 420 employs feedback from feedback loop 408 to condition an output signal 406, and a separate device 410 is provided to complete the transition of the output signal 406 to VCS. When the input 405 is low, output 406 is initially VDD and output 330 is low. Device 410 turns on to pull-up output 406 to VCS and a feedback inverter 414 turns off a transistor 440 disconnecting VDD from the output 406. Now, a gate and source of device 444 are both VCS. Devices 444 and 446 form an inverter 448. The self shutdown implementation of level shifter 402 has only a two gate delay latency compared with the three delays for the design of FIG. 3.

Figure 5:
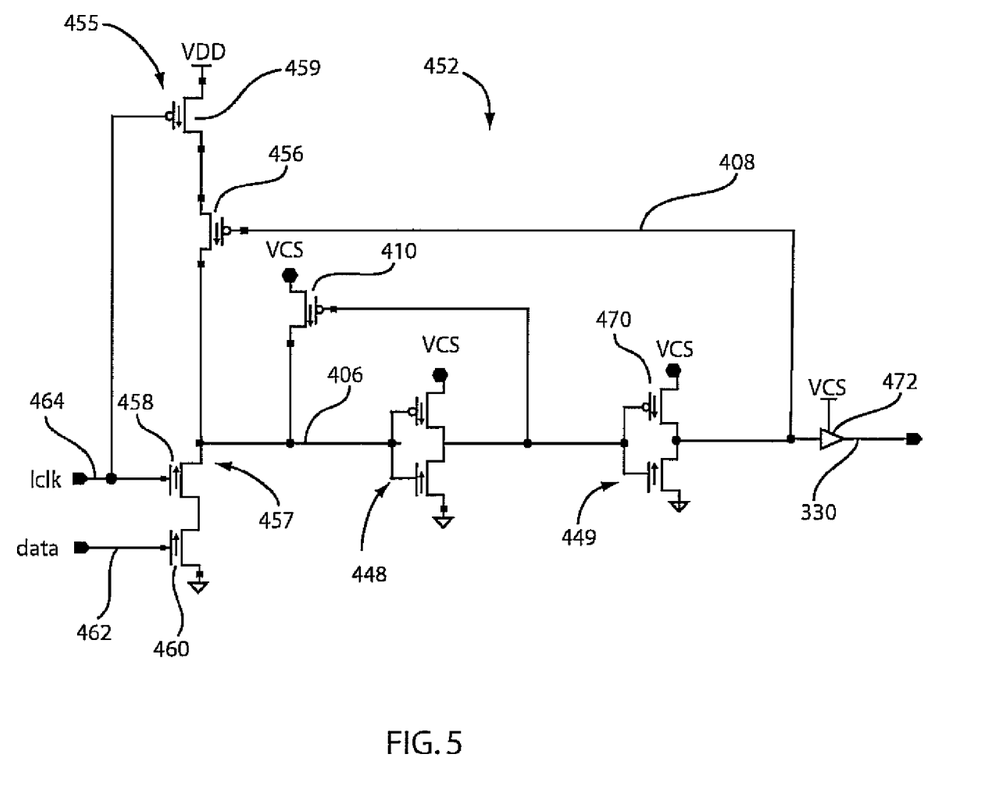
FIG. 5 is a schematic diagram showing a level shifter having a self shutdown mechanism feedback loop where the level shifter is responsive to a local clock pulse in accordance with one embodiment.

Referring to FIG. 5, another self shutdown level shifter 455 is illustratively depicted in accordance with another embodiment. Level shifter 455 includes a single data input 462 (differential signals are not needed), which is coupled to a transistor stack 457 of the level shifter 455. The stack 457 includes transistors 458, 459. Transistor 458 is enabled and disabled in accordance with a local clock (lclk) signal 464. The data 460 enters the VCS domain only when permitted to do so by transistor 458 in accordance with the clock signal 464.

This embodiment describes gating of data 462 using a local clock (lclk) 464. When lclk 464 and data 462 are "high" in evaluation mode, a node 408 goes "low" (node 408 is a feedback loop). After that an inverter 472 (VCS powers inverter 472) causes the output 330 to go high to a wordline. A low value of node 408 turns transistor 410 "on". When lclk goes low (standby) then an input node for lclk 464 is low and turns the connected transistor 459 "on". A series transistor 456 is already "on". These two "on" transistors (458 and 456) precharge node 406 "high". When node 406 turns on, it is held on by transistor 410, while a feedback transistor 456 is turned off This permits a higher VDD–VCS difference.

A feedback controlled VDD pull-up stack 457 employs feedback from feedback loop node 408 to condition the output signal 406, and device 410 is provided to hold the output signal 406 to VCS. When the input data 462 is low, output 406 is initially VDD and output 330 is low. Device 410 turns on to pull-up output 406 to VCS and an inverter 449 turns off a transistor 456 disconnecting VDD from the output 406. Now, a gate and source of device 470 are both VCS. The self shutdown implementation of level shifter 452 has three gate delay latency. It should be understood that any of the embodiments described herein and in accordance with the present principles may be adapted to have a clock signal 464 employed to enable/disable an input to a level shifter.

Figure 6:
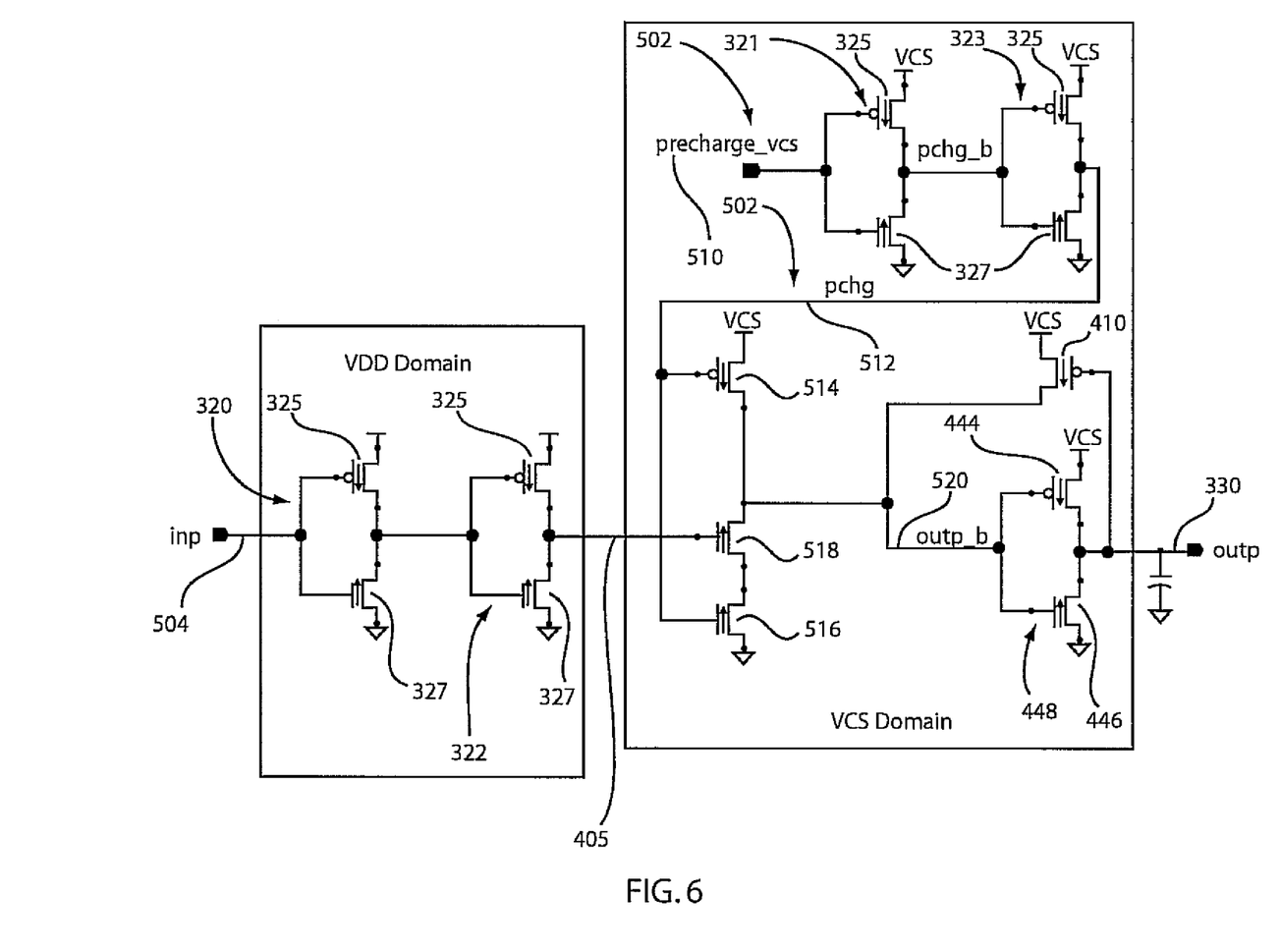
FIG. 6 is a schematic diagram showing a level shifter having a dynamic precharge input in accordance with one embodiment.

Referring to FIG. 6, a dynamic implementation of a level shifter 502 is illustratively shown. The dynamic implementation of level shifter 502 includes a precharge_vcs signal 510 acting as the clock. Input signal 504 may be either static or pulsed, which make input 405 either static or pulsed.

Precharge_vcs signal 510 is delayed by inverters 321 and 323 to provide a precharge signal 512 to transistors 514 and 516. Transistors 514 and 516 control an output 520 in accordance with the precharge signal 512 and the input signal 405 on transistor 518. A device 410 is provided to complete the transition of the output signal 520 to VCS.

There is a two delay latency, however the dynamic implementation reduces the internal capacitive loading resulting in a faster circuit compared with the previous implementations. The precharge_vcs signal 510 should be derived from VCS, therefore a second level shifter (not shown) may be employed to generate this signal.

Figure 7:
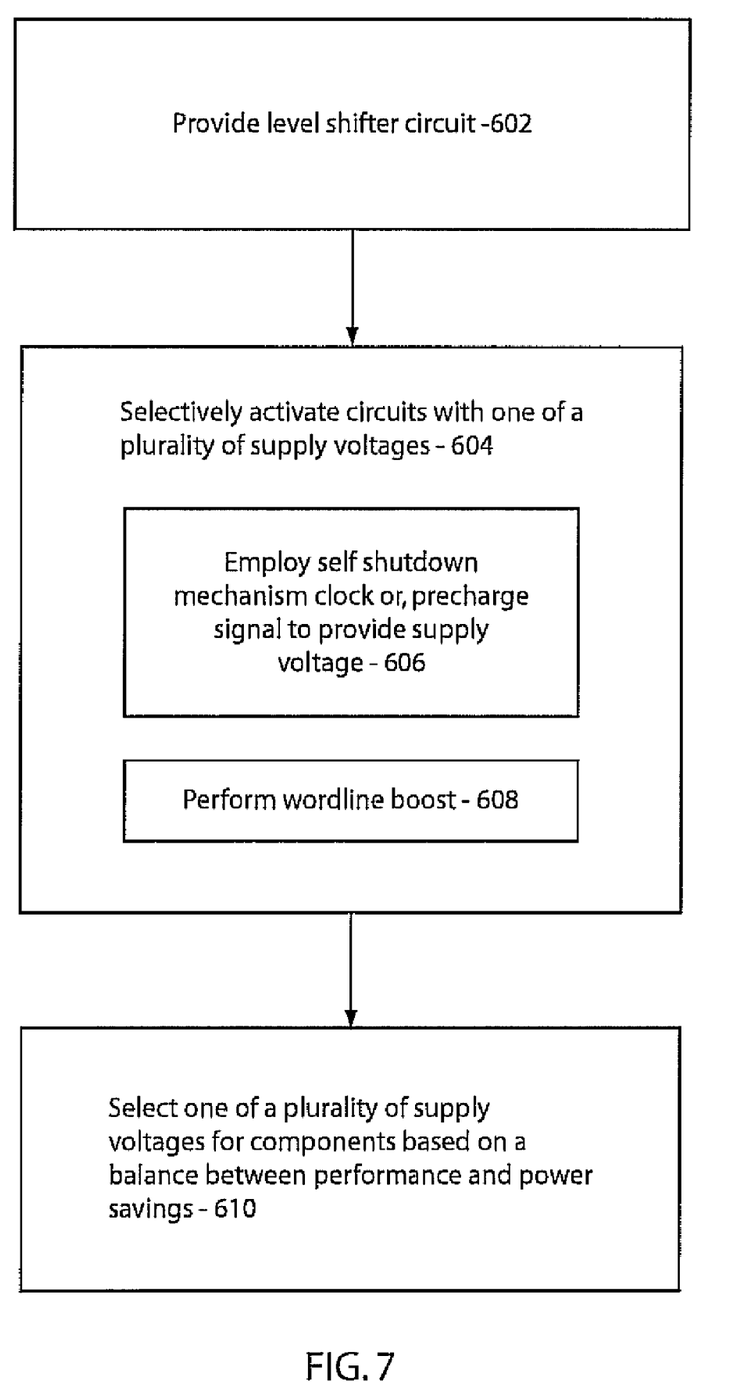
FIG. 7 is a block diagram showing providing and employing a level shifter to balance between power savings and performance in accordance with another embodiment.

Referring to FIG. 7, a method for selectively reducing power is illustratively depicted. In block 602, a level shifter is provided and coupled between first circuits and second circuits where the first circuits are powered by a first supply voltage and the second circuits are powered by one of the first supply voltage and a second supply voltage. In block 604, the second circuits are selectively activated with one of the first supply voltage and the second supply voltage in accordance with an input signal to balance between performance and power savings.

The selective activation of the second circuits may include, in block 606, employing a self shutdown feedback loop to select between the first supply voltage and the second supply voltage or employing a precharge signal to gate the input signal to perform the selection of the supply voltage output. In block 608, the second circuits may include a wordline driver, and a wordline boost during a memory operation may be performed.

In one embodiment, the level shifter may input words or bits employed to selectively control the supply power to a plurality of different circuits. For example, under a first condition, full power may be needed so all circuits may be powered with VDD. Under a second condition, a boost power may be needed to overcharge components. In that case VCS may be employed for specific circuits. In still another condition, supply voltage less than VDD may be employed to reduce power consumption.

The input to the level shifter may include an indication of the conditions so that a balance between performance and power savings may be struck in block 610.

Figure 8:
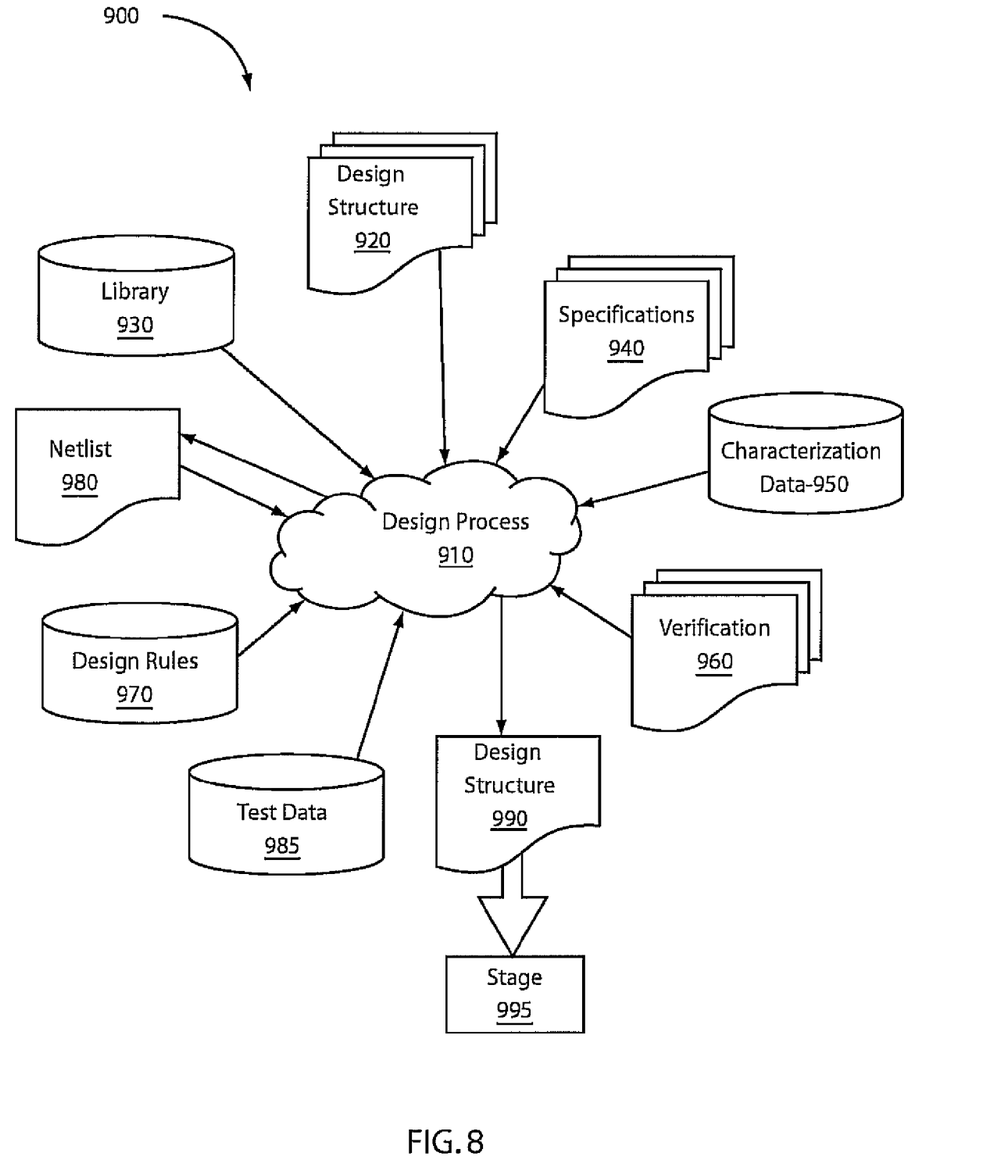
FIG. 8 is a flow diagram of a design process used in semiconductor design, manufacture, and/or test.

Referring to FIG. 8, a block diagram of an exemplary design flow 900 used, for example, in semiconductor design, manufacturing, and/or testing is shown. Design flow 900 may vary depending on the type of integrated circuit (IC) being designed. For example, a design flow 900 for building an application specific IC (ASIC) may differ from a design flow 900 for designing a standard component. Design structure 920 is preferably an input to a design process 910 and may come from an IP provider, a core developer, or other design company or may be generated by the operator of the design flow, or from other sources. Design structure 920 comprises an embodiment of the invention as shown in FIGS. 3-6 in the form of schematics or HDL, a hardware-description language (e.g., Verilog, VHDL, C, etc.). Design structure 920 may be included on one or more machine readable medium. For example, design structure 920 may be a text file or a graphical representation of an embodiment of the invention as shown in FIGS. 3-6. Design process 910 preferably synthesizes (or translates) an embodiment of the invention as shown in FIGS. 3-6 into a netlist 980, where netlist 980 is, for example, a list of wires, transistors, logic gates, control circuits, I/O, models, etc. that describes the connections to other elements and circuits in an integrated circuit design and recorded on at least one of machine readable medium. This may be an iterative process in which netlist 980 is resynthesized one or more times depending on design specifications and parameters for the circuit.

Design process 910 may include using a variety of inputs; for example, inputs from library elements 930 which may house a set of commonly used elements, circuits, and devices, including models, layouts, and symbolic representations, for a given manufacturing technology (e.g., different technology nodes, 32 nm, 45 nm, 90 nm, etc.), design specifications 940, characterization data 950, verification data 960, design rules 970, and test data files 985 (which may include test patterns and other testing information). Design process 910 may further include, for example, standard circuit design processes such as timing analysis, verification, design rule checking, place and route operations, etc. One of ordinary skill in the art of integrated circuit design can appreciate the extent of possible electronic design automation tools and applications used in design process 910 without deviating from the scope and spirit of the invention. The design structure of the invention is not limited to any specific design flow.

Design process 910 preferably translates an embodiment of the invention as shown in FIGS. 3-6, along with any additional integrated circuit design or data (if applicable), into a second design structure 990. Design structure 990 resides on a storage medium in a data format used for the exchange of layout data of integrated circuits and/or symbolic data format (e.g. information stored in a GDSII (GDS2), GL1, OASIS, map files, or any other suitable format for storing such design structures). Design structure 990 may comprise information such as, for example, symbolic data, map files, test data files, design content files, manufacturing data, layout parameters, wires, levels of metal, vias, shapes, data for routing through the manufacturing line, and any other data required by a semiconductor manufacturer to produce an embodiment of the invention as shown in FIGS. 3-6. Design structure 990 may then proceed to a stage 995 where, for example, design structure 990: proceeds to tape-out, is released to manufacturing, is released to a mask house, is sent to another design house, is sent back to the customer, etc.

Having described preferred embodiments of a level shifter and method for boosting wordline voltage and memory cell performance (which are intended to be illustrative and not limiting), it is noted that modifications and variations can be made by persons skilled in the art in light of the above teachings. It is therefore to be understood that changes may be made in the particular embodiments disclosed which are within the scope and spirit of the invention as outlined by the appended claims. Having thus described aspects of the invention, with the details and particularity required by the patent laws, what is claimed and desired protected by Letters Patent is set forth in the appended claims.

What is claimed is:

1. A memory circuit, comprising:
   first circuits powered by a first supply voltage and second circuits powered by a second supply voltage;
   a level shifter coupled between the first circuits and the second circuits, the level shifter configured to select a supply voltage output for a circuit including one of the first supply voltage and the second supply voltage in accordance an input signal, where the input signal depends on at least one of an operation to be performed and a component performing the operation; and
   a self shutdown mechanism included in the level shifter to select the supply voltage output, wherein the self shutdown mechanism includes a feedback loop from an output configured to activate the supply voltage output.

2. The circuit as recited in claim 1, wherein the level shifter includes a differential circuit.

3. The circuit as recited in claim 1, wherein the feedback loop includes a separate device configured to assist in transitioning between supply voltages.

4. The circuit as recited in claim 1, wherein the level shifter includes a precharge input, where a precharge signal is employed to gate the input signal to perform the selection of a supply voltage output.

5. The circuit as recited in claim 4, further comprising a separate device configured to assist in transitioning between supply voltages.

6. The circuit as recited in claim 1, wherein the operation to be performed includes one of a read and write operation and the component performing the operation includes a wordline of a memory device.

7. The circuit as recited in claim 1, wherein one of the first and second supply voltage includes a wordline boost voltage.

8. The circuit as recited in claim 1, further comprising a device configured to enable an input to the level shifter by employing a clock signal.

9. A memory circuit, comprising:
   an address decoder circuit configured to decode memory addresses to activate memory cells, the address decoder circuit having a first supply voltage;
   a wordline driver circuit configured to activate wordlines in accordance with decoded memory addresses; and
   a level shifter coupled to the address decoder circuit and to the wordline diver circuit, the level shifter configured to select a supply voltage output including one of the first supply voltage and a second supply voltage in accordance an input signal, where the input signal depends on at least one of an operation to be performed and a component performing the operation.

10. The circuit as recited in claim 9, wherein the level shifter includes a self shutdown mechanism including a feedback loop from the output configured to activate the supply voltage output and the feedback loop includes a separate device configured to assist in transitioning between supply voltages.

11. The circuit as recited in claim 9, wherein the level shifter includes a precharge input where a precharge signal is employed to gate the input signal to perform the selection of a supply voltage output.

12. The circuit as recited in claim 9, wherein the operation to be performed includes one of a read and write operation and the component performing the operation includes a wordline of a memory device.

13. The circuit as recited in claim 9, further comprising a device configured to enable an input to the level shifter by employing a clock signal.

14. A method for selectively reducing power, comprising:
providing a level shifter coupled between first circuits and second circuits where the first circuits are powered by a first supply voltage and the second circuits powered by one of the first supply voltage and a second supply voltage; and
selectively activating the second circuits with one of the first supply voltage and the second supply voltage in accordance with an input signal to balance between performance and power savings wherein selectively activating the second circuits includes employing a self shutdown feedback loop to select between the first supply voltage and the second supply voltage.

15. The method as recited in claim 14, wherein selectively activating the second circuits includes employing a precharge signal to gate the input signal to select a supply voltage output.

16. The method as recited in claim 14, wherein the second circuits include a wordline driver and the method further comprising performing a wordline boost during a memory operation.

17. The method as recited in claim 14, wherein selectively activating the second circuits includes employing a clock signal to gate the input signal to select a supply voltage output.

18. A memory circuit, comprising:
first circuits powered by a first supply voltage and second circuits powered by a second supply voltage; and
a level shifter coupled between the first circuits and the second circuits, the level shifter configured to select a supply voltage output for a circuit including one of the first supply voltage and the second supply voltage in accordance an input signal, where the input signal depends on at least one of an operation to be performed and a component performing the operation, wherein the level shifter includes a precharge input, where a precharge signal is employed to gate the input signal to perform the selection of a supply voltage output.

* * * * *